United States Patent
Park et al.

(10) Patent No.: US 8,934,305 B2
(45) Date of Patent: Jan. 13, 2015

(54) NONVOLATILE MEMORY DEVICE, METHOD OF OPERATING THE SAME AND ELECTRONIC DEVICE INCLUDING THE SAME

(75) Inventors: Jae-Woo Park, Suwon-si (KR); Jung-No Im, Gunpo-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 323 days.

(21) Appl. No.: 13/479,467

(22) Filed: May 24, 2012

(65) Prior Publication Data
US 2013/0016565 A1     Jan. 17, 2013

(30) Foreign Application Priority Data
Jul. 11, 2011   (KR) .................. 10-2011-0068607

(51) Int. Cl.
| | | |
|---|---|---|
| G11C 16/34 | (2006.01) | |
| G11C 16/06 | (2006.01) | |
| G11C 16/10 | (2006.01) | |
| G11C 11/56 | (2006.01) | |
| G11C 16/04 | (2006.01) | |

(52) U.S. Cl.
CPC ........ G11C 16/3459 (2013.01); G11C 11/5628 (2013.01); G11C 16/0483 (2013.01)
USPC ............ 365/185.22; 365/185.09; 365/185.17; 365/185.18; 365/185.02; 365/185.24

(58) Field of Classification Search
CPC ........... G11C 11/5628; G11C 16/3459; G11C 16/0483
USPC ............ 365/185.02, 185.09, 185.17, 185.18, 365/185.22, 185.24, 185.25
See application file for complete search history.

(56) References Cited

U.S. PATENT DOCUMENTS

| | | | | |
|---|---|---|---|---|
| 7,023,736 | B2 * | 4/2006 | Cernea et al. ............ | 365/185.21 |
| 7,492,640 | B2 * | 2/2009 | Mokhlesi ................. | 365/185.21 |
| 7,599,224 | B2 | 10/2009 | Lee | |
| 7,719,891 | B2 * | 5/2010 | Lim ......................... | 365/185.09 |
| 2008/0181009 | A1 * | 7/2008 | Arai et al. ................ | 365/185.17 |
| 2010/0002507 | A1 | 1/2010 | Kang et al. | |
| 2010/0034019 | A1 | 2/2010 | Kang et al. | |
| 2011/0058427 | A1 * | 3/2011 | Choi et al. ............... | 365/185.25 |
| 2011/0188310 | A1 * | 8/2011 | Kim ......................... | 365/185.11 |

(Continued)

FOREIGN PATENT DOCUMENTS

| | | |
|---|---|---|
| JP | 2010-532541 A | 10/2010 |
| KR | 10-2010-0004767 A | 1/2010 |

(Continued)

*Primary Examiner* — J. H. Hur
(74) *Attorney, Agent, or Firm* — Muir Patent Consulting, PLLC

(57) ABSTRACT

A nonvolatile memory device and a method of operating the same are provided. The method includes performing a plurality of program operations on a plurality of memory cells each to be programmed to one of a plurality of program states, performing a program-verify operation on programmed memory cells associated with each of the plurality of program states, the program-verify operation comprises, selecting one of the plurality of offsets based on a noise level of a common source line associated with a programmed memory cell, using the selected offset to select one of a first verify voltage and a second verify voltage higher than the first verify voltage, and verifying a program state of the programmed memory cell using the first verify voltage and the second verify voltage.

19 Claims, 16 Drawing Sheets

(56) References Cited

U.S. PATENT DOCUMENTS

2011/0194353 A1*  8/2011  Hwang et al. ............ 365/185.19
2011/0292724 A1* 12/2011  Kim ........................ 365/185.03
2012/0155186 A1*  6/2012  Chokan et al. ........... 365/185.22

FOREIGN PATENT DOCUMENTS

| KR | 10-2010-0018318 A | 2/2010 |
| KR | 10-2010-0057784 A | 6/2010 |

* cited by examiner

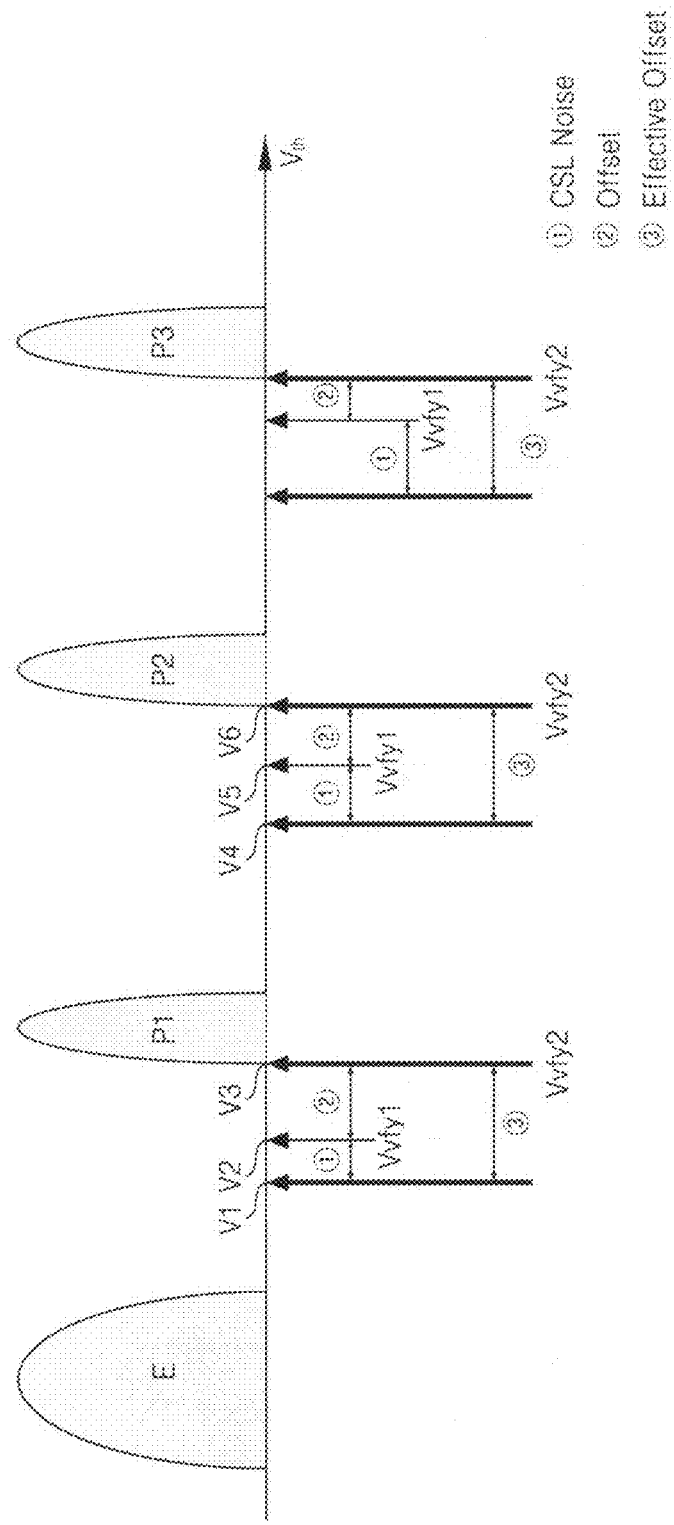

NONVOLATILE MEMORY DEVICE, METHOD OF OPERATING THE SAME AND ELECTRONIC DEVICE INCLUDING THE SAME

CROSS-REFERENCE TO RELATED APPLICATIONS

This application claims priority under 35 U.S.C. §119(a) from Korean Patent Application No. 10-2011-0068607 filed on Jul. 11, 2011, the disclosure of which is hereby incorporated by reference in its entirety.

BACKGROUND

Various example embodiments relate to a nonvolatile memory device, and more particularly, to a nonvolatile memory device for controlling a program-verify operation according to a noise level of a common source line, a method of operating the same and an electronic device including the same.

Semiconductor memory device includes a volatile memory device and a nonvolatile memory device. The volatile memory device includes a dynamic random access memory (DRAM), a static random access memory (SRAM) and etc. The nonvolatile memory device includes a flash memory, Electrically Erasable Programmable Read-Only memory (EEPROM), a resistive memory and etc.

Flash memory includes a memory cell array which stores data. The memory cell array includes a plurality of memory blocks each of which includes a plurality of pages. Each of the pages includes a plurality of memory cells.

The memory cells are classified as on-cells and off-cells according to the distribution of their threshold voltages. The flash memory may perform an erase operation in units of memory blocks and may perform a program operation or a read operation in units of pages.

The flash memory includes a cell string structure. A cell string includes a plurality of transistors connected in series between a string selection transistor connected to a string selection line (SSL) and a ground selection transistor connected to a ground selection line (GSL). The string selection transistor is connected to a bit line and the ground selection transistor is connected to a common source line (CSL).

Each of the memory cells may be implemented by a single level cell (SLC) storing a single bit or a multi-level cell (MLC) storing a plurality of bits. The MLC has an erased state and a plurality of programmed states according to its threshold voltage. It is important to the MLC to narrow the width of a threshold voltage distribution of each programmed states so that a margin for the programmed state is secured. CSL noise may cause the width of the threshold voltage distribution for each programmed state to increase.

The CSL noise signifies an increase of the voltage of the CSL due to current flowing in an on-cell during the read operation or the program-verify operation. When the voltage of a source node of the ground selection transistor may increase due to the CSL noise, current flowing in the on-cell is decreased even through a word line voltage or a bit line voltage does not change. As a result, the threshold voltage of the on-cell is increased, and therefore, the on-cell may be wrongly determined as an off-cell. This wrong determination causes errors in the read operation or the program-verify operation.

SUMMARY

According to some embodiments of the present disclosure, there is provided a method of operating a nonvolatile memory device. The method includes performing a plurality of program operations on a plurality of memory cells each to be programmed to one of a plurality of program states, and performing a program-verify operation on programmed memory cells of the plurality of memory cells. The programmed memory cells are associated with each of the plurality of program states. The program-verify operation includes selecting one of a plurality of offsets based on a noise level of a common source line associated with a programmed memory cell of the programmed memory cells, using the selected offset to select one of a first verify voltage and a second verify voltage higher than the first verify voltage, and verifying a program state of the programmed memory cell using the first verify voltage and the second verify voltage. The selected offset is a difference between the first verify voltage and the second verify voltage.

According to some embodiments of the present disclosure, there is provided a method of programming a nonvolatile memory device. The method includes performing a plurality of program operations for programming the memory cells to a plurality of program states, selecting a first verify voltage for a first programmed memory cell, selecting a first verify voltage for a second programmed memory cell, selecting a first verify voltage for a second programmed memory cell, performing a program-verify operation on the first programmed memory cell including verifying a program state of the first programmed memory cell using the first verify voltage associated with the first programmed memory cell and a second verify voltage associated with the first programmed memory cell, wherein the second verify voltage associated with the first programmed memory cell is higher than the first verify voltage associated with the first programmed memory cell, performing a program-verify operation on the second programmed memory cell including verifying a program state of the second programmed memory cell using the first verify voltage associated with the second programmed memory cell and a second verify voltage associated with the second programmed memory cell, wherein the second verify voltage associated with the second programmed memory cell is higher than the first verify voltage associated with the second programmed memory cell. For each of the first and second programmed memory cells, selecting the first verify voltage includes selecting a first voltage when a noise level of a common source line associated with each of the first and second programmed memory cells is at a first level and selecting a second voltage when a noise level of a common source line associated with each of the first and second programmed memory cells is at a second level higher than the first level. A difference between the first voltage associated with the first programmed memory cell and the second verify voltage associated with the first programmed memory cell is greater than a difference between the second voltage associated with the first programmed memory cell and the second verify voltage associated with the first programmed memory cell.

According to other embodiments of the present disclosure, there is provided a nonvolatile memory device including a memory cell array including a plurality of memory cells configured to be programmed to a plurality of program states; a control logic circuit configured to select one of a plurality of offsets based on a noise level of a common source line associated with a programmed memory cell to be programmed to a particular program state among the plurality of program states, and generate a control signal for controlling the selected offset to be used to select one of a first-stage verify voltage and a second verify voltage; and a voltage generator configured to generate the first-stage verify voltage or the second-stage verify voltage in response to the control signal during a program-verify operation of the programmed memory cell. The program-verify operation includes a two-stage program-verify operation having a first program-verify operation step and a second program-verify operation step. The first program-verify operation step is performed using the first-stage verify voltage and the second program-verify operation step is performed using the second-stage verify voltage higher than the first-stage verify voltage. The selected offset is a difference between the first-stage verify voltage and the second-stage verify voltage. Lower offset values are associated with programmed memory cells subject to higher noise level caused by the common source line and higher offset values are associated with programmed memory cells subject to lower noise level caused by the common source line.

BRIEF DESCRIPTION OF THE DRAWINGS

Exemplary embodiments will be more clearly understood from the following detailed description taken in conjunction with the accompanying drawings in which:

FIG. 4A is a diagram showing the threshold voltage distributions of a plurality of nonvolatile memory cells included in the memory cell array illustrated in FIG. 1 and voltages used in a program-verify operation according to some embodiments;

DETAILED DESCRIPTION OF THE EMBODIMENTS

Figure 1:
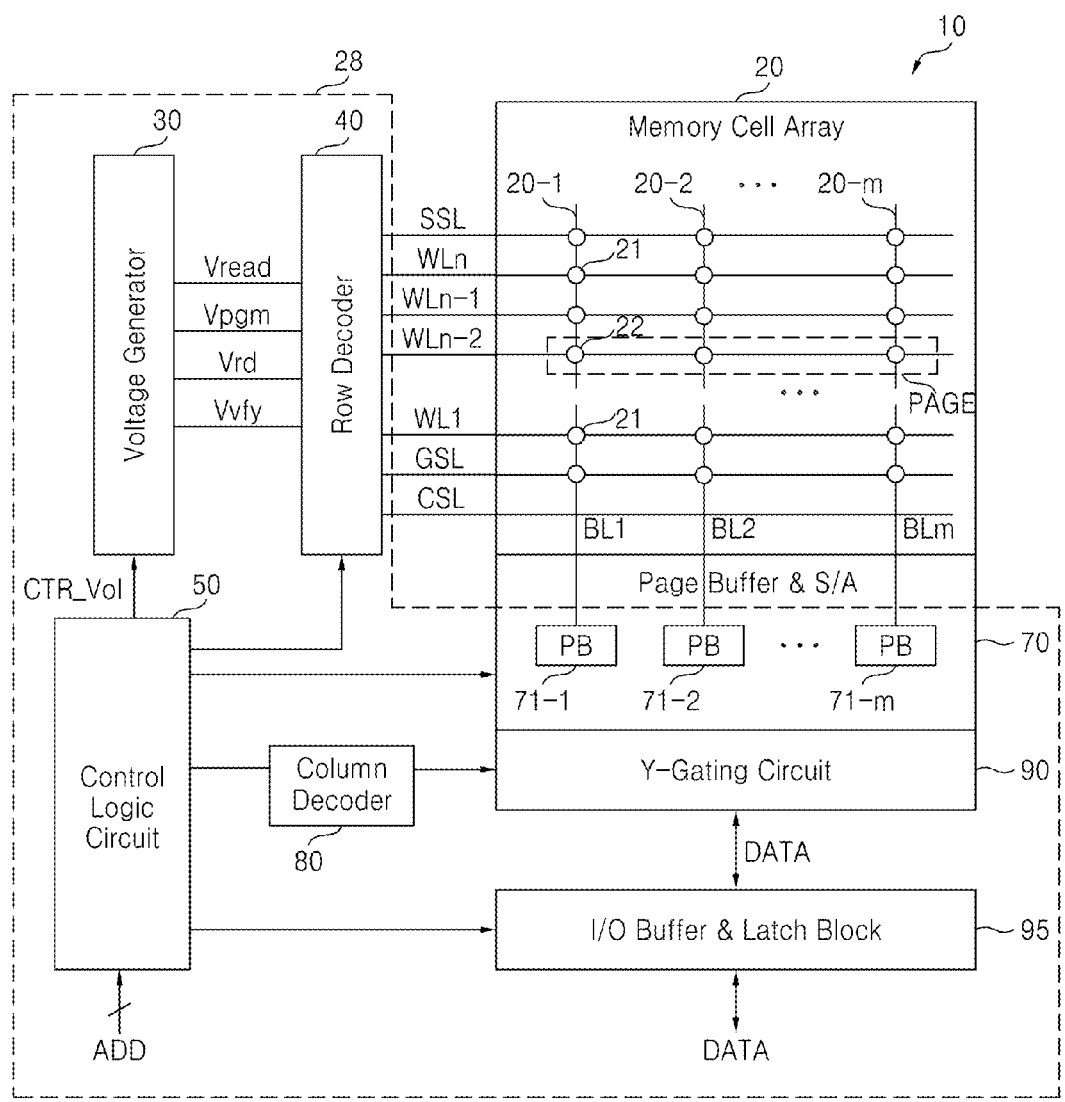
FIG. 1 is a block diagram of a nonvolatile memory device according to some embodiments.

Various example embodiments will be described more fully hereinafter with reference to the accompanying drawings, in which embodiments are shown. The present disclosure may, however, be embodied in many different forms and should not be construed as limited to the embodiments set forth herein. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present disclosure, and will not be interpreted in an idealized or overly formal sense unless expressly so defined herein.

Figure 2:
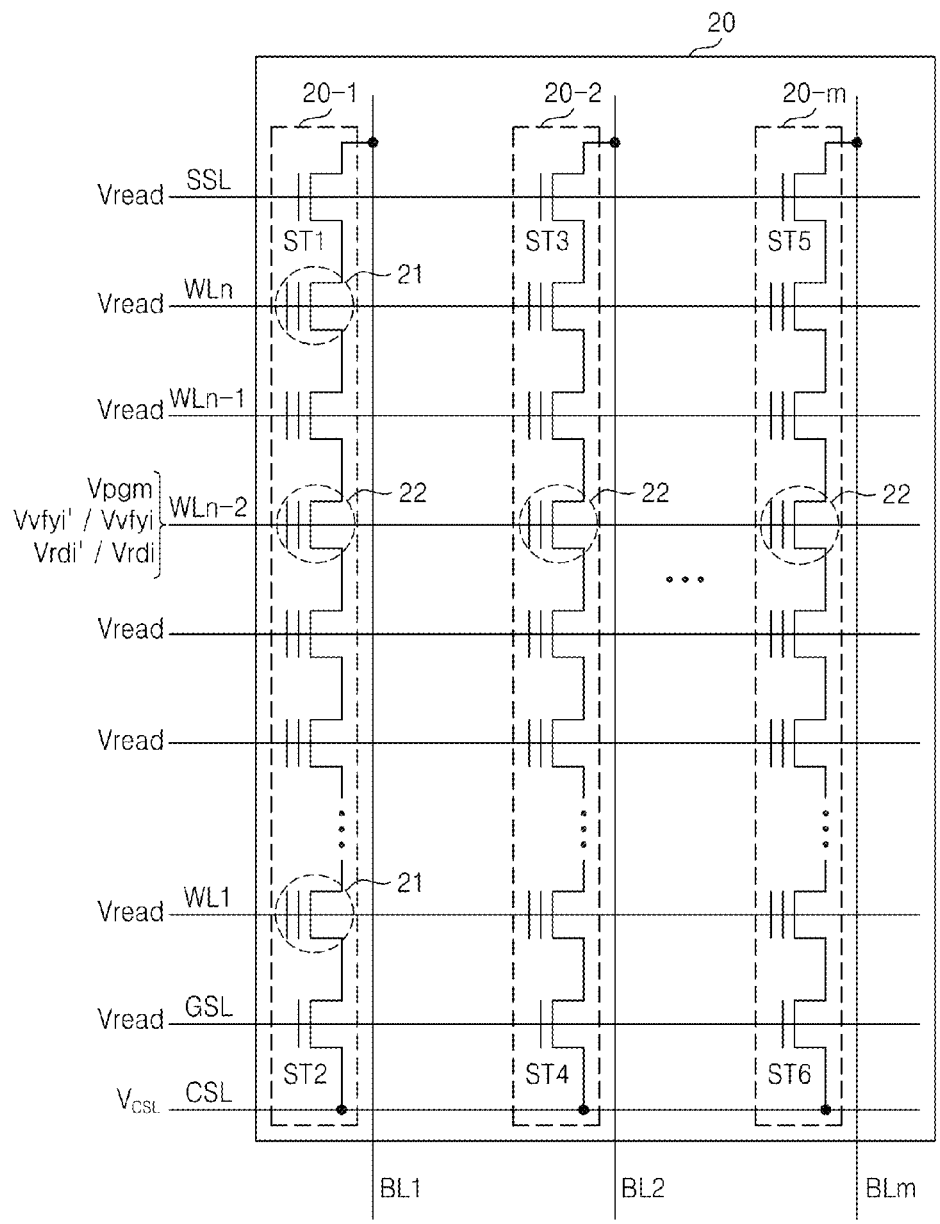
FIG. 2 is a diagram of a memory cell array illustrated in FIG. 1 according to some embodiments.
Figure 3:
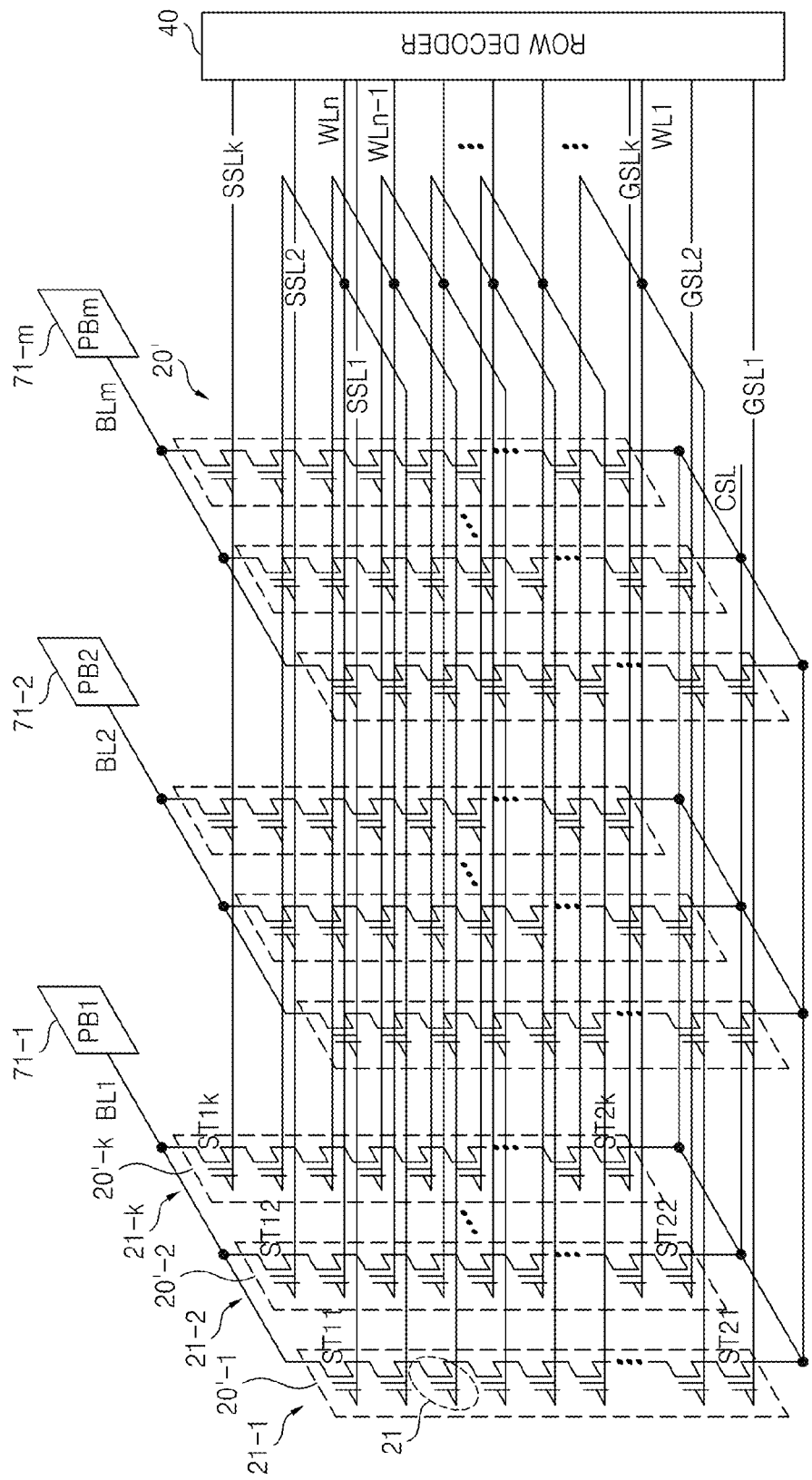
FIG. 3 is a diagram of the memory cell array illustrated in FIG. 1 according to other embodiments.

FIG. 1 is a block diagram of a nonvolatile memory device 10 according to some embodiments. FIG. 2 is a diagram of a memory cell array 20 illustrated in FIG. 1 according to some embodiments. FIG. 3 is a diagram of a memory cell array 20' according to other embodiments.

Referring to FIG. 1, the nonvolatile memory device 10 includes the memory cell array 20 which stores data, an access circuit 28 which performs a data access operation, such as a program operation, a read operation or an erase operation, on the memory cell array 20, and a control circuit which controls the data access operation of the access circuit 28.

The memory cell array 20 includes a plurality of cell strings 20-1, 20-2, ..., 20-$m$ where "m" is a natural number. Each of the cell strings 20-1 through 20-$m$ includes a plurality of nonvolatile memory cells connected in series.

As illustrated in FIG. 2, the cell strings 20-1 through 20-$m$ may be laid out or embodied on one plane or layer in two dimensions.

FIG. 1 shows the memory cell array 20 and a page buffer and sense amplifier (S/A) block 70 which are embodied in two dimensions.

The first cell string 20-1 includes a plurality of nonvolatile memory cells connected in series between a first selection transistor (or a string selection transistor) ST1 connected to a bit line BL1 and a second selection transistor (or a ground selection transistor) ST2 connected to a common source line (CSL).

The second cell string 20-2 includes a plurality of nonvolatile memory cells connected in series between a third selection transistor (or a string selection transistor) ST3 connected to a bit line BL2 and a fourth selection transistor (or a ground selection transistor) ST4 connected to the CSL.

The m-th cell string 20-$m$ includes a plurality of nonvolatile memory cells connected in series between a fifth selection transistor (or a string selection transistor) ST5 connected to a bit line BLm and a sixth selection transistor (or a ground selection transistor) ST6 connected to the CSL.

The nonvolatile memory cells included in the cell strings 20-1 through 20-$m$ may be implemented by flash electrically erasable programmable read-only memory (EEPROM) cells which can store one or more bits.

Each of the nonvolatile memory cells may be implemented by a NAND flash memory cell storing at least one bit, e.g., a single level cell (SLC) or a multi-level cell (MLC). Accordingly, each of the cell strings 20-1 through 20-$m$ may be referred to as a NAND cell string.

Referring to FIG. 3, cell strings 20'-1, 20'-2, ..., 20'-$k$ (where "k" is a natural number) may be laid out on different planes in three dimensions.

The first cell string 20'-1 may be laid out on a first layer 21-1, the second cell string 20'-2 may be laid out on a second layer 21-2 different from the first layer 21-1, and the k-th cell string 20'-$k$ may be laid out on a k-th layer 21-$k$ different from the second layer 21-2.

The layers 21-1 through 21-$k$ may be formed in a wafer stack, a chip stack, or a cell stack. Each of the layers 21-1 through 21-$k$ includes a plurality of cell strings.

The first cell string 20'-1 on the first layer 21-1 includes a plurality of nonvolatile memory cells, e.g., NAND flash memory cells, connected in series between a plurality of selection transistors ST11 and ST21.

The second cell string 20'-2 on the second layer 21-2 includes a plurality of nonvolatile memory cells, e.g., NAND flash memory cells, connected in series between a plurality of selection transistors ST12 and ST22.

The k-th cell string 20'-$k$ on the k-th layer 21-$k$ includes a plurality of nonvolatile memory cells, e.g., NAND flash memory cells, connected in series between a plurality of selection transistors ST1$k$ and ST2$k$.

A row decoder 40 may provide a selection signal (e.g., a read voltage Vread in a read operation, a power supply voltage Vcc in a program operation, or 0 V in an erase operation) to each of the string selection lines SSL1 through SSLk respectively connected to gates of the respective first selection transistors ST11 through ST1$k$ embodied on the respective layers 21-1 through 21-$k$. Accordingly, the each of the first selection transistors ST11 through ST1$k$ may be selectively turned on or off.

The row decoder 40 may also provide a selection signal (e.g., the read voltage Vread in the read operation, 0 V in the program operation, or 0 V in the erase operation) to each of the ground selection lines GSL1 through GSLk respectively connected to gates of the respective second selection transistors ST21 through ST2$k$ embodied on the respective layers 21-1 through 21-$k$. Accordingly, the each of the second selection transistors ST21 through ST2$k$ may be selectively turned on or off.

As shown in FIG. 3, the cell strings 20'-1 through 20'-$k$ may share with one another a plurality of word lines WL1 through WLn, the CSL, and the bit line BL1. In other words, cell strings at corresponding positions in the respective layers 21-1 through 21-$k$ may be connected to a corresponding one of page buffers 71-1 through 71-$m$ included in the page buffer and S/A block 70.

Hereinafter, the operation of the nonvolatile memory device 10 will be described on the assumption that the cell string 20'-1 laid out on the first layer 21-1 among the layers 21-1 through 21-$k$ embodied in the three-dimensional memory cell array 20' is selected by the row decoder 40.

The memory cell array 20 represents the two-dimensional memory cell array 20 illustrated in FIG. 2 and the three-dimensional memory cell array 20' illustrated in FIG. 3 as a whole.

Here, a data access operation includes a read operation and a program-verify operation. The program-verify operation includes a program-verify operation and an erase-verify operation.

The program-verify operation is an operation of determining whether a threshold voltage of a selected memory cell has reached a predetermined value after a program operation. The erase-verify operation is an operation of determining whether a threshold voltage of a selected memory cell has reached a predetermined value after an erase operation.

The program-verify operation may be carried out in two stages. In detail, precharge and a first-stage verify sensing is performed on all bit lines and on-cells and off-cells are determined in a coarse sensing stage of the two-stage program-verify operation. Only cells in a current verification state among the cells determined as the off-cells in the coarse sensing stage are precharged and second-stage verify sensed in a fine sensing stage of the two-stage program-verify operation.

In other words, the cell that has been determined as the off-cell in the coarse sensing stage (first-stage verify sensing) but has been determined as the on-cell in the fine sensing stage (second-stage verify sensing) has not passed verification and needs to be programmed in a subsequent program loop. At this time, the cell is programmed using bit line forcing (e.g., 1V), so that a memory cell distribution is improved.

The access circuit 28 may include a voltage generator 30, the row decoder 40, the page buffer and S/A block 70, a column decoder 80, a Y-gating circuit 90, and an input/output (I/O) buffer and latch block 95.

The voltage generator 30 is controlled by a control logic circuit 50 to generate a plurality of voltages including a program voltage Vpgm used to perform a program operation, a plurality of voltages including read voltages Vread and Vrd used to perform a read operation, or a plurality of voltages including an erase voltage used to perform an erase operation and output the voltages to the row decoder 40.

During a program operation, the row decoder 40 applies the program voltage Vpgm to a selected word line (e.g., WLn−2) among the word lines WL1 through WLn in response to a row address and applies a pass voltage to all of the word lines WL1 through WLn except for the selected word line WLn−2. The program operation may be performed using incremental step pulse programming (ISPP). It is assumed that nonvolatile memory cells 22 connected to the selected word line WLn−2 are selected memory cells.

During a program-verify operation, the row decoder 40 applies a program-verify voltage Vvfy to the selected word line WLn−2.

During a read operation, the row decoder 40 applies the selected read voltage Vrd in response to the row address to the selected word line WLn−2 among the word lines WL1 through WLn and applies the unselected read voltage Vread to all of the word lines WL1 through WLn except for the selected word line WLn−2.

The voltage generator 30 generates a word line voltage in response to a control signal received from the control logic circuit 50. The word line voltage $V_{WL}$ includes the program voltage Vpgm applied to a selected word line among a plurality of word lines during the program operation or the program-verify voltage Vvfy applied to the selected word line during the program-verify operation. The program-verify voltage Vvfy may be a value selected using an offset set in response to a CSL noise level according to the control signal of the control logic circuit 50. The offset is a level difference between a first voltage (e.g., a coarse sensing voltage, first verify voltage, or first-stage verify voltage) and a second voltage (e.g., a fine sensing voltage, second verify voltage, or second-stage verify voltage) when a memory cell is sensed in two stages.

In addition, the word line voltage includes the selected read voltage Vrd applied to a selected word line among a plurality of word lines during the read operation or the unselected read voltage Vread applied to all of the word lines except for the selected word line.

The page buffer and S/A block 70 may include the page buffers 71-1 through 71-m. The page buffers 71-1 through 71-m are connected to a plurality of bit lines BL1 through BLm, respectively.

Each of the page buffers 71-1 through 71-m functions as a driver for programming data to the memory cell array 20 during the program operation according to the control of the control logic circuit 50. In addition, according to the control of the control logic circuit 50, each of the page buffers 71-1 through 71-m functions as an S/A which senses and amplifies a voltage level of corresponding one of the bit lines BL1 through BLm during the read operation or the program-verify operation.

According to the control of the control logic circuit 50, each of the page buffers 71-1 through 71-m may sense and amplify the voltage level of the corresponding one of the bit lines BL1 through BLm as many times as the program-verify voltage Vvfy is applied to the selected word line (e.g., WLn−2).

The column decoder 80 is controlled by the control logic circuit 50 to decode a column address and output a decoded signal to the Y-gating signal 90.

The Y-gating circuit 90 may control transmission of data between the page buffer and S/A block 70 and the I/O buffer and latch block 95 in response to the decoded signal received from the column decoder 80.

The I/O buffer and latch block 95 may transmit data from an outside to the Y-gating circuit 90 or transmit data from the Y-gating circuit 90 to the outside through a plurality of I/O pads.

The control logic circuit 50 may store a plurality of predetermined offsets, select one of the plurality of offsets based on a CSL noise level, and adjust a two-stage verify voltage based on the selected offset. Alternatively, the control logic circuit 50 may adjust a plurality of offsets by using a fuse circuit (e.g., an e-fuse circuit).

The adjusted two-stage verify voltage may include a first-stage verify voltage and a second-stage verify voltage as threshold voltages which reflect the selected offset. The selected offset may be separately used to select one of the first and second-stage verify voltages. The CSL noise level may correspond to at least one of the position of a word line coupled to a programmed memory cell, the number of program operations performed on memory cells and the programmed state of the programmed memory cell.

The access circuit 28 may perform the program-verify operation using the two-stage verify voltage adjusted by the control logic circuit 50. The structure and the operations of the control logic circuit 50 will be described in detail with reference to FIGS. 4 and 5 later.

Figure 4B:
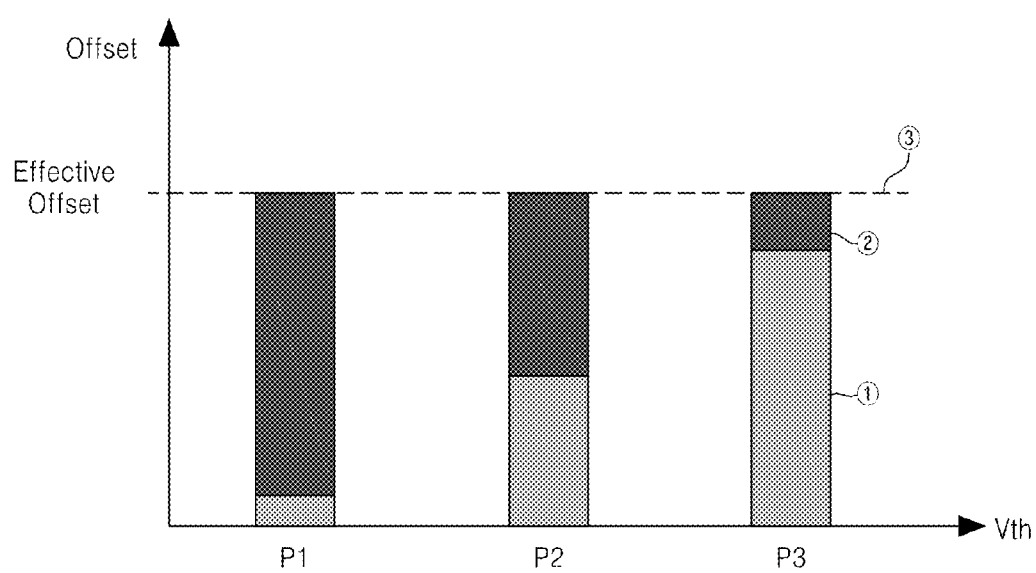
FIG. 4B is a graph of the offsets versus the programmed states of the nonvolatile memory cells included in the memory cell array illustrated in FIG. 1 according to some embodiments.

FIG. 4A is a diagram showing the threshold voltage distributions of a plurality of nonvolatile memory cells included in the memory cell array 20 illustrated in FIG. 1, voltages used in a read operation, and voltages used in a program-verify operation according to some embodiments. FIG. 4B is a graph of the offsets versus the programmed states of the nonvolatile memory cells included in the memory cell array 20 illustrated in FIG. 1 according to some embodiments.

It is assumed that each of the memory cells connected to the selected word line WLn−2 is programmed to one state among E, P1, P2 and P3 states in order to check the change in a CSL voltage $V_{CSL}$ with respect to the number of on-cells. Here, the E state indicates an erased state and a memory cell in the P3 state has the highest threshold voltage. A memory cell in the P1 or P2 state has a threshold voltage corresponding to a medium level between the E state and the P3 state. In addition, it is assumed that when the memory cells connected to the selected word line are on-cells, currents flowing in cell strings respectively connected to the memory cells are I0, I1, I2 and I3.

According to these assumptions, the CSL voltage $V_{CSL}$ varies with the number of on-cells. For instance, when memory cell in the E state is only an on-cell and the other memory cells are off-cells, the CSL voltage $V_{CSL}$ is I0*Rc. a resistance Rc is a loaded and/or parasitic resister of the common source line CSL. When a memory cell in the E state and a memory cell in the P1 state are on-cells, the CSL voltage $V_{CSL}$ is (I0+I1)*Rc. Similarly, when a memory cell in the E state, a memory cell in the P1 state and a memory cell in the P2 state are on-cells, the CSL voltage $V_{CSL}$ is (I0+I1+I2)*Rc. In other words, when the number of on-cells changes during the program-verify operation and the read operation, the CSL voltage $V_{CSL}$ may be changed.

Voltage drop may occur in the CSL due to parasitic resistance or parasitic capacitance existing in the CSL. When the CSL voltage $V_{CSL}$ exists at this time, the selected memory cell may operate at a lower voltage than the externally applied voltage to the selected memory cell. The CSL voltage $V_{CSL}$ may change in each memory cell according to a CSL noise level, i.e., the position of a word line coupled to the memory cell, the number of program operations performed on the memory cells or the programmed state of the memory cell.

In the two-stage program-verify operation, a first-stage verify voltage Vvfy1 is applied to the selected word line and then a second-stage verify voltage Vvfy2 is applied to the selected word line. The second-stage verify voltage Vvfy2 may be higher than the first-stage verify voltage Vvfy1, as illustrated in FIG. 4A.

The offset is a level difference between the first-stage verify voltage Vvfy1 and the second-stage verify voltage Vvfy2 and determines the gain of the distribution. Since a voltage drop ① in the CSL may vary with CSL noise, the two-stage program-verify operation can be more accurately performed on a memory cell regardless of a programming method when the offset is adjusted.

Referring to FIG. 4A, an effective offset may be used to result in a maximum two-stage sensing effect. In one embodiment, one or more of a plurality of offsets are values predetermined according to chip characteristics or predetermined by a designer.

Alternatively, one or more of a plurality of offsets may be determined by using a fuse circuit (e.g., an e-fuse circuit). The plurality of offsets may be stored as values corresponding to a CSL noise level in the control logic circuit 50. One of offsets corresponding to CSL noise levels of respective memory cells may be set as the effective offset. Alternatively, an adjustment voltage allowing an offset to be used to a verify voltage may be stored corresponding to a CSL noise level in the control logic circuit 50.

Accordingly, a different offset ② corresponding to the CSL noise level of a memory cell may be applied to the memory cell according to the programmed state (e.g., the P1, P2 or P3 state) of the memory cell to obtain the effective offset and the verify voltage Vvfy is adjusted according to the effective offset in the two-stage program-verify operation, so that the two-stage program-verification effect can be used efficiently.

The offset ② may be used to select one of the first-stage verify voltage Vvfy1 or the second-stage verify voltage Vvfy2. For instance, let's assume that the CSL noise is X (①), the offset is Y (②), the effective offset is Z (③) and an offset between the first-stage verify voltage Vvfy1 and the second-stage verify voltage Vvfy2 is K, that is, Z=X+Y and |Vvfy2−Vvfy1|=K.

In one embodiment, referring to FIG. 4A, a method of programming a nonvolatile memory device is provided. For example, at least one program operation for programming a first memory cell associated with a first program state (P1) and a second memory cell associated with a second program state (P2) may be performed. Consecutively, a program-verify operation on first memory cell may be performed. The program-verify operation for the first memory cell may be performed using a voltage V2 that refers to a first verify voltage Vvfy1 and a voltage V3 that refers to a second verify voltage Vvfy2. An effective offset (e.g., V3−V1) may be predetermined by a controller or by a user. In addition, the effective offset (e.g., V3−V1) may be adjusted by a fuse circuit (e.g., an e-fuse circuit). When the program-verify operation for the first memory cell is performed, a noise voltage (e.g., V2−V1) may appear on a common source line CSL associated with the first memory cell. If the noise voltage (V2−V1) increases the voltage difference (V3−V2) may decrease to ensure the effective offset voltage (V3−V1). On the other hand, if the noise voltage (V2−V1) decreases the voltage difference (V3−V2) may increase to ensure the effective offset voltage (V3−V1). Accordingly, the voltage V2 that refers to the first verify voltage Vvfy1 may be determined based on the noise voltage (V2−V1) of the common source line CSL associated with the first memory cell. In addition, a program-verify operation for the second memory cell may be performed using a voltage V5 that refers to a first verify voltage Vvfy1 and a voltage V6 that refers to a second verify voltage Vvfy2. An effective offset (e.g., V6−V4) may be predetermined by a controller or by a user. In addition, the effective offset (V6−V4) may be adjusted by a fuse circuit (e.g., an e-fuse circuit). When the program-verify operation for the second memory cell is performed, a noise voltage (e.g., V5−V4) may appear on a common source line CSL associated with the second memory cell. If the noise voltage (V5−V4) increases the voltage difference (V6−V5) may decrease to ensure the effective offset voltage (V6−V4). On the other hand, if the noise voltage (V5−V4) decreases the voltage difference (V6−V5) may increase to ensure the effective offset voltage (V6−V4). Accordingly, the voltage V5 that refers to the first verify voltage Vvfy1 may be determined based on the noise voltage (V5−V4) of the common source line CSL associated with the second memory cell.

Referring to FIG. 4B, when a precharge voltage is applied to all bit lines and the first-stage verify voltage Vvfy1 is applied to the selected word line during the program-verify operation, the CSL noise level ① increases as the programmed state changes from the P1 stated to the P2 state and then the P3 state. At this time, two-stage program-verification effect can be obtained with respect to a state, e.g., the P1 state, by using the second-stage verify voltage Vvfy2 with the offset from the first-stage verify voltage Vvfy1. However, when the CSL noise level is greater than the offset, the state of a memory cell in the P2 or P3 state may not be correctly sensed even by using the second-stage verify voltage Vvfy2 as well as the first-stage verify voltage Vvfy1. Accordingly, the two-stage program-verification effect may not be used efficiently with only the predetermined offset.

As illustrated in FIG. 4B, when the offset ② caused by the CSL noise changes depending on the programmed state, the offset ② changes depending on the effective offset ③. In other words, the offset between the first and second-stage verify voltages Vvfy1 and Vvfy2 originally set for the two-stage program-verify operation is K. However, according to the present embodiments, the offset ② is used to select the first-stage verify voltage Vvfy1, so that an adjusted offset between the first-stage verify voltage Vvfy1 and the second-stage verify voltage Vvfy2 is K+X, where X may be a positive or negative real number.

When the two-stage program-verify operation is performed using the effective offset, cells that would not be correctly sensed due to CSL noise can be sensed with a verify voltage obtained considering the CSL noise, and therefore, the performance of the program-verify operation can be increased and sensing errors due to the CSL noise in the upper distribution of each cell state can be minimized.

Figure 5:
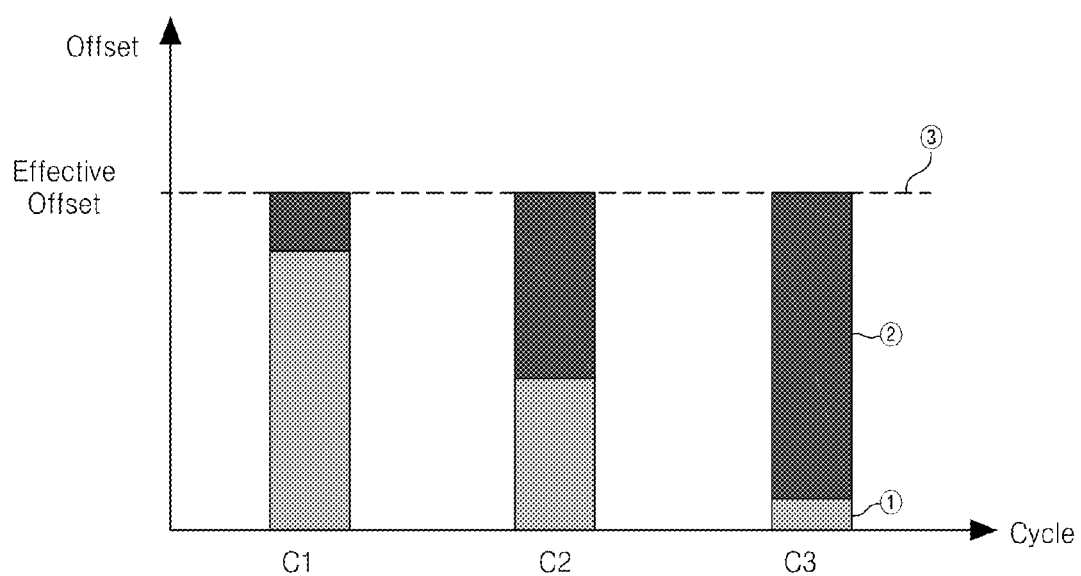
FIG. 5 is a graph of the offsets versus the numbers of program-verify operations performed on the nonvolatile memory cells included in the memory cell array illustrated in FIG. 1 according to some embodiments.

FIG. 5 is a graph of the offsets versus the numbers of program-verify operations performed on the nonvolatile memory cells included in the memory cell array 20 illustrated in FIG. 1 according to some embodiments.

Referring to FIG. 5, when all bit lines are precharged with a precharge voltage in the two-stage program-verify operation, a CSL noise level varies with the number of program operations performed on the memory cell array 20.

When a first program cycle C1 is compared with a second program cycle C2 in the graph illustrated in FIG. 5, an offset due to CSL noise in the first program cycle C1 is greater than that in the second program cycle C2. As a program operation is repeated, the number of verified memory cells (i.e., program-passed memory cells) increases. Accordingly, the number of program operations increases, the CSL noise level decreases. Therefore, a different offset ② is applied corresponding to a CSL noise level ① in each program cycle, so that an effective offset ③ is used in the two-stage program-verify operation, thereby efficiently using the two-stage program-verification effect.

Figure 6:
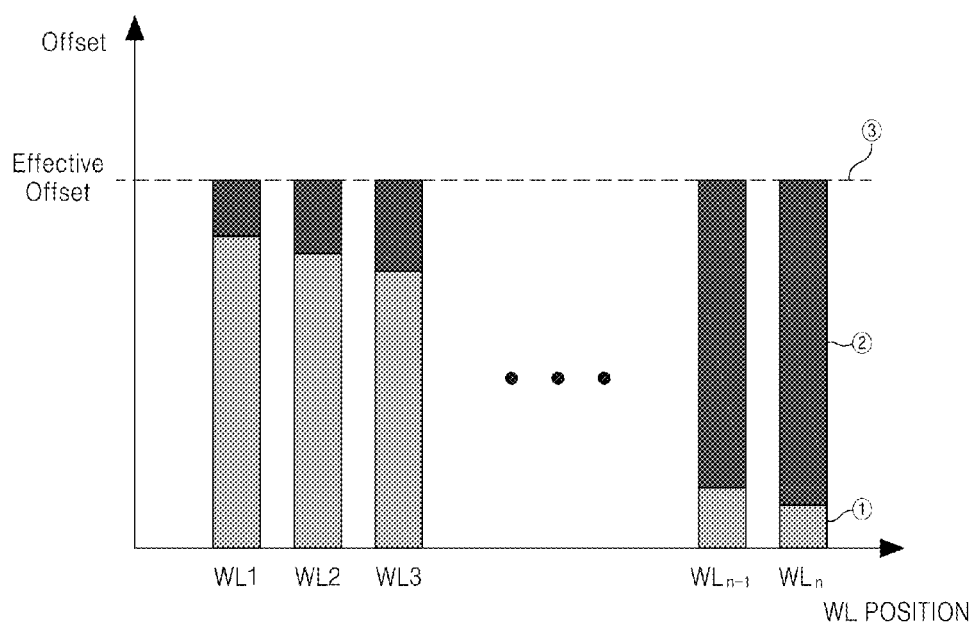
FIG. 6 is a graph of the offsets versus the word line positions of the nonvolatile memory cells included in the memory cell array illustrated in FIG. 1 according to some embodiments.

FIG. 6 is a graph of the offsets versus the word line positions of the nonvolatile memory cells included in the memory cell array 20 illustrated in FIG. 1 according to some embodiments.

Referring to FIG. 6, when all bit lines are precharged with a precharge voltage in the two-stage program-verify operation, a CSL noise level varies with the position of a word line in the memory cell array 20.

When the first word line WL1 is compared with the n-th word line WLn in the graph illustrated in FIG. 6, CSL noise occurring when the word line WL1 selected and all bit lines are precharged is greater than CSL noise occurring when the word line WLn is selected and all bit lines are precharged. During a program operation, the word lines WL1 through WLn are programmed beginning with the word line W1 and proceeding toward the word line WLn, and therefore, the word line WL1 is most frequently programmed and thus has the greatest noise. Accordingly, the position of a word line moves from WL1 toward WLn, a CSL noise level ① gradually decreases.

Therefore, when a different offset ② is applied corresponding to the CSL noise level ① in each word line to obtain an effective offset ③, the two-stage program-verification effect can be efficiently used.

Figure 7:
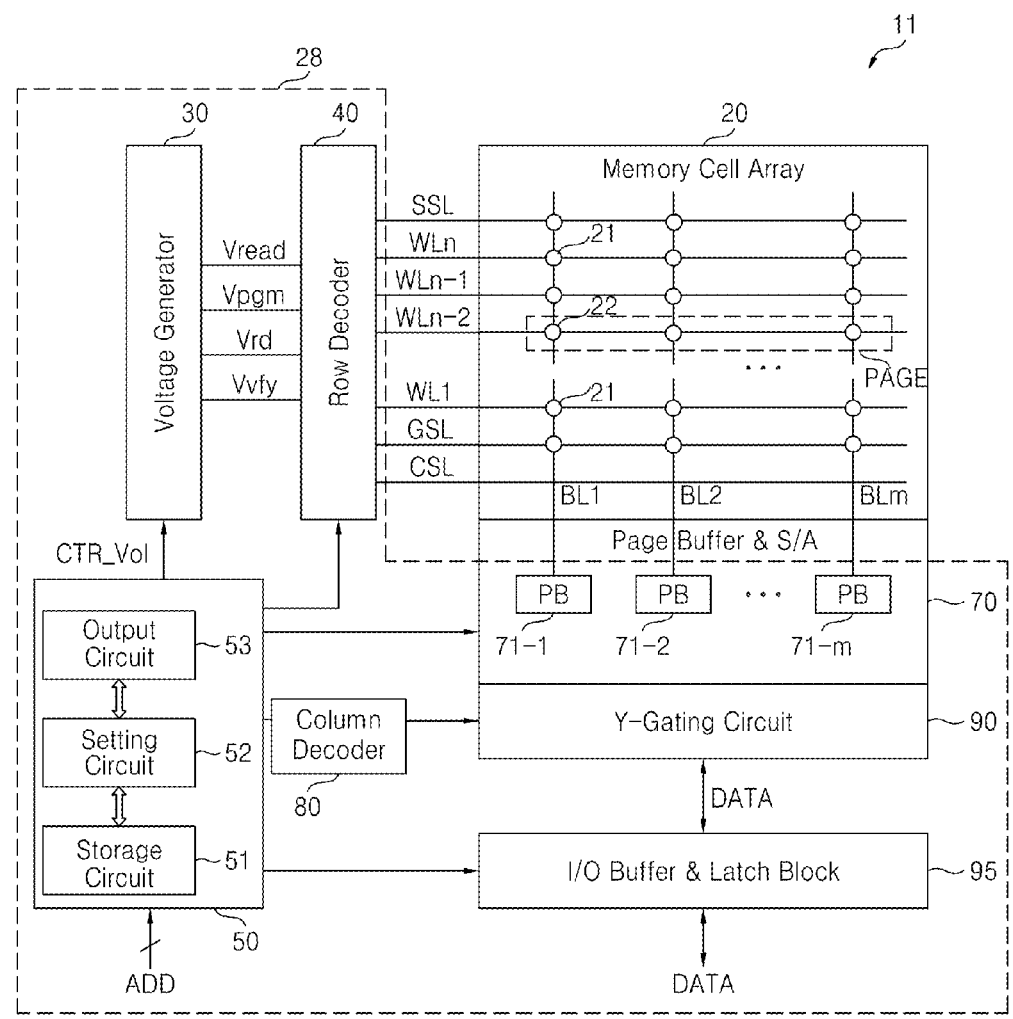
FIG. 7 is a block diagram of a nonvolatile memory device according to other embodiments.

FIG. 7 is a block diagram of a nonvolatile memory device 11 according to other embodiments. The nonvolatile memory device 11 includes the memory cell array 20 which stores data and the access circuit 28 which performs a data access operation, such as a program operation, a read operation or an erase operation, on the memory cell array 20. For convenience' sake in the description, differences from the embodiments illustrated in FIG. 1, that is, the control logic circuit 50 will be described.

The control logic circuit 50 controls internal elements of the nonvolatile memory device 11 and controls a program operation and a program-verify operation according to the present embodiments. The control logic circuit 50 may include a program control circuit (not shown), a program-verify circuit (not shown) and a pass/fail verification circuit (not shown).

The program control circuit outputs internal control signals (not shown) for controlling the operations (e.g., the program operation, the erase operation and the read operation) of the nonvolatile memory device 11. In other words, the program control circuit controls the overall operation of the nonvolatile memory device 11. It may control the internal elements of the nonvolatile memory device 11 so that memory cells are programmed by the ISPP or bit line forcing method.

The program-verify circuit performs the program-verify operation. For instance, the program-verify circuit may perform a first-stage program-verify operation using a first-stage verify voltage using an offset and then perform a second-stage program-verify operation using a second-stage verify voltage. For example, the first-stage program-verify operation is coarse sensing and the second-stage program-verify operation is fine sensing. In other words, consecutively performing the first-stage program-verify operation and the second-stage program-verify operation may signify performing coarse-fine sensing. For example, the program-verify circuit may include a storage circuit 51, a setting circuit 52 and an output circuit 53.

The storage circuit 51 may store a plurality of offsets predetermined considering CSL noise occurring in a program loop. Alternatively, the storage circuit 51 may include a fuse circuit configured to adjust offset values. For example, the fuse circuit includes an e-fuse circuit adaptable even after manufacturing the memory device.

When a memory cell is programmed, the setting circuit 52 may select one of the offsets stored in the storage circuit 51 as an effective offset based on a CSL noise level of the programmed memory cell.

The output circuit 53 outputs a control signal CTR_Vol for generating a verify voltage with selected offset to ensure the effective offset.

The pass/fail verification circuit is connected with the program-verify circuit and the program control circuit. When the program-verify circuit performs a program-verify operation on the programmed memory cell, the pass/fail verification circuit determines a program pass or a program fail with respect to the programmed memory cell.

Figure 8:
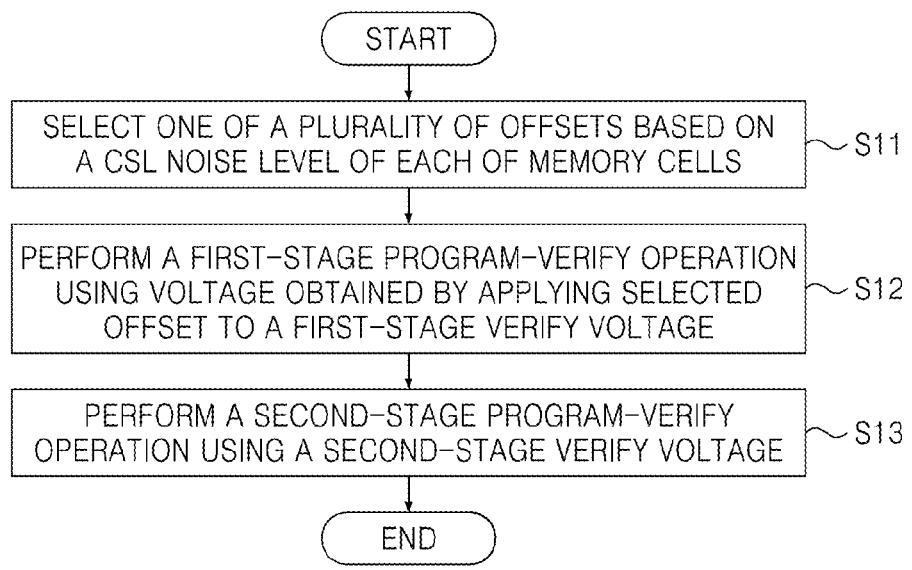
FIG. 8 is a flowchart of a method of operating the nonvolatile memory device illustrated in FIG. 1 according to some embodiments.

FIG. 8 is a flowchart of a method of operating the nonvolatile memory device 10 illustrated in FIG. 1 according to some embodiments. Referring to FIG. 8, the nonvolatile memory device 10 select one of a plurality of offsets based on a CSL noise level of each of the memory cells in operation S11. For example, each of the plurality of offsets may be a value predetermined according to chip characteristics or predetermined by a designer. The control logic circuit 50 may store the offsets corresponding to a CSL noise level. Alternatively, one of the offsets may select by using a fuse circuit, e.g., an e-fuse circuit etc. For example, the CSL noise level may correspond to the position of the selected word line, the number of program operations performed on memory cells or the programmed state of the memory cell.

The nonvolatile memory device 10 performs a program operation on the nonvolatile memory cells that are connected to the selected word line and will store the page data. The program operation may be carried out using the ISPP method.

Since programmed memory cells have a distribution including CSL noise, the control logic circuit 50 uses the selected offset to select a two-stage verify voltage when a program-verify operation is performed on each of the programmed memory cells. For example, a first-stage program-verify operation is performed using a voltage obtained by applying the selected offset to a first-stage verify voltage (e.g., a coarse sensing voltage) in operation S12. Thereafter, a second-stage program-verify operation is performed using a second-stage verify voltage (e.g., a fine sensing voltage) in operation S13.

At this time, the control logic circuit 50 generates the control signal CTR_Vol for performing a two-stage program-verify operation on each programmed memory cell and outputs the control signal CTR_Vol to the voltage generator 30. The control signal CTR_Vol is a signal which controls the voltage generator 30 to generate a voltage by using the selected offset to select a verify voltage. The voltage generator 30 outputs an adjusted verify voltage in response to the control signal CTR_Vol, so that the two-stage program-verify operation is performed using the adjusted verify voltage.

Figure 9:
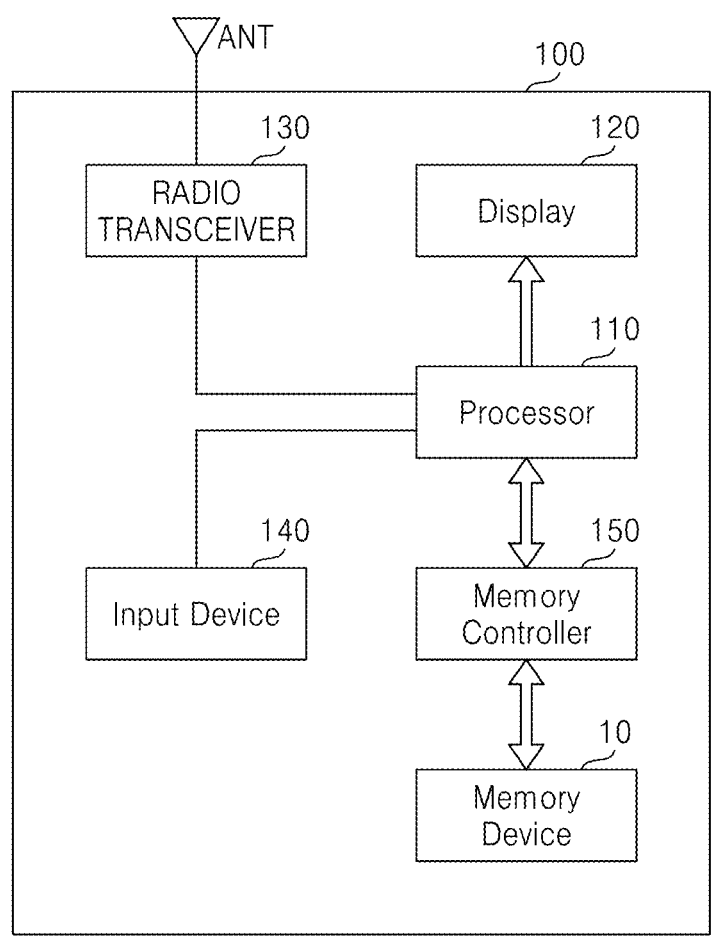
FIG. 9 is a block diagram of an electronic device including the non-volatile memory device illustrated in FIG. 1 according to some embodiments.

FIG. 9 is a block diagram of an electronic device 100 including the non-volatile memory device 10 illustrated in FIG. 1 according to some embodiments. Referring to FIG. 9, the electronic device 100 may be implemented as a cellular phone, a smart phone, a tablet personal computer (PC), a personal digital assistant (PDA) or a radio communication system.

The electronic device 100 includes the non-volatile memory device 10 and a memory controller 150 controlling the operations of the non-volatile memory device 10. The memory controller 150 may control the data access operations, e.g., a program operation, an erase operation, and a read operation, of the non-volatile memory device 10 according to the control of a processor 110.

The data programmed in the non-volatile memory device 10 may be displayed through a display 120 according to the control of the processor 110 and/or the memory controller 150.

A radio transceiver 130 transmits or receives radio signals through an antenna ANT. The radio transceiver 130 may convert radio signals received through the antenna ANT into signals that can be processed by the processor 110.

Accordingly, the processor 110 may process the signals output from the radio transceiver 130 and transmit the processed signals to the memory controller 150 or the display 120. The memory controller 150 may program the signals processed by the processor 110 to the non-volatile memory device 10. The radio transceiver 130 may also convert signals output from the processor 110 into radio signals and outputs the radio signals to an external device through the antenna ANT.

An input device 140 enables control signals for controlling the operation of the processor 110 or data to be processed by the processor 110 to be input to the memory system 100. The input device 140 may be implemented by a pointing device such as a touch pad, a computer mouse, a keypad, or a keyboard.

The processor 110 may control the operation of the display 120 to display data output from the memory controller 150, data output from the radio transceiver 130, or data output from the input device 140. The memory controller 150, which controls the operations of the non-volatile memory device 10, may be implemented as a part of the processor 110 or as a separate chip.

Figure 10:
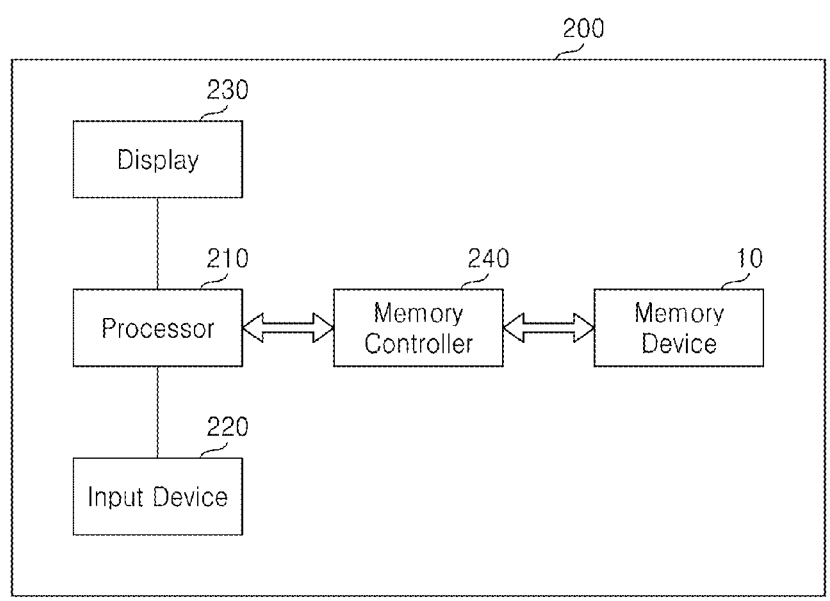
FIG. 10 is a block diagram of an electronic device including the non-volatile memory device illustrated in FIG. 1 according to other embodiments.

FIG. 10 is a block diagram of an electronic device 200 including the non-volatile memory device 10 illustrated in FIG. 1 according to other embodiments. The electronic device 200 may be implemented as a PC, a tablet PC, a net-book, an e-reader, a PDA, a portable multimedia player (PMP), an MP3 player, or an MP4 player.

The electronic device 200 may include the non-volatile memory device 10 and a memory controller 240 controlling the data processing operations of the non-volatile memory device 10. A processor 210 may display data stored in the non-volatile memory device 10 through a display 230 according to data input through an input device 220. The input device 220 may be implemented by a pointing device such as a touch pad, a computer mouse, a keypad, or a keyboard.

The processor 210 may control the overall operation of the memory system 200 and the operations of the memory controller 240. The memory controller 240, which may control the operations of the non-volatile memory device 10, may be implemented as a part of the processor 210 or as a separate chip.

Figure 11:
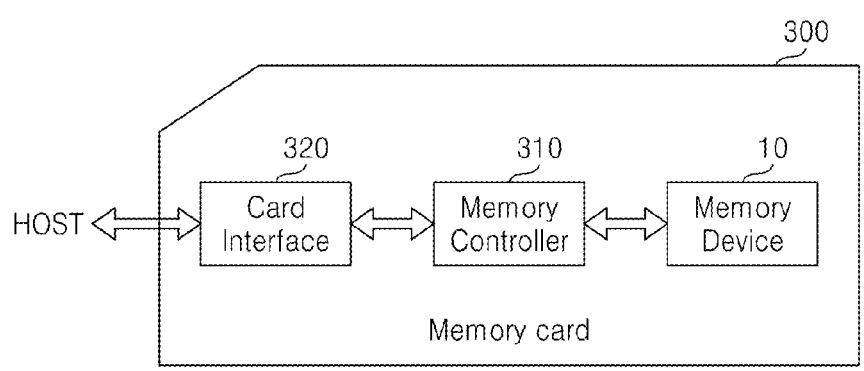
FIG. 11 is a block diagram of an electronic device including the non-volatile memory device illustrated in FIG. 1 according to further embodiments.

FIG. 11 is a block diagram of an electronic device 300 including the non-volatile memory device 10 illustrated in FIG. 1 according to further embodiments. The electronic device 300 may be implemented as a memory card or a smart card. The electronic device 300 includes the non-volatile memory device 10, a memory controller 310, and a card interface 320.

The memory controller 310 may control data exchange between the non-volatile memory device 10 and the card interface 320. The card interface 320 may be a secure digital (SD) card interface or a multi-media card (MMC) interface, but the inventive concept is not restricted to the current embodiments.

The card interface 320 may interface a host 330 and the memory controller 310 for data exchange according to a protocol of the host 330. The card interface 320 may support a universal serial bus (USB) protocol and an interchip (IC)-USB protocol. Here, the card interface 320 may indicate a hardware supporting a protocol used by the host 330, a software installed in the hardware, or a signal transmission mode.

When the electronic device 300 is connected with the host 330 such as a PC, a tablet PC, a digital camera, a digital audio player, a cellular phone, a console video game hardware, or a digital set-top box, a host interface 350 of the host 330 may perform data communication with the non-volatile memory device 10 through the card interface 320 and the memory controller 310 according to the control of a microprocessor 340.

Figure 12:
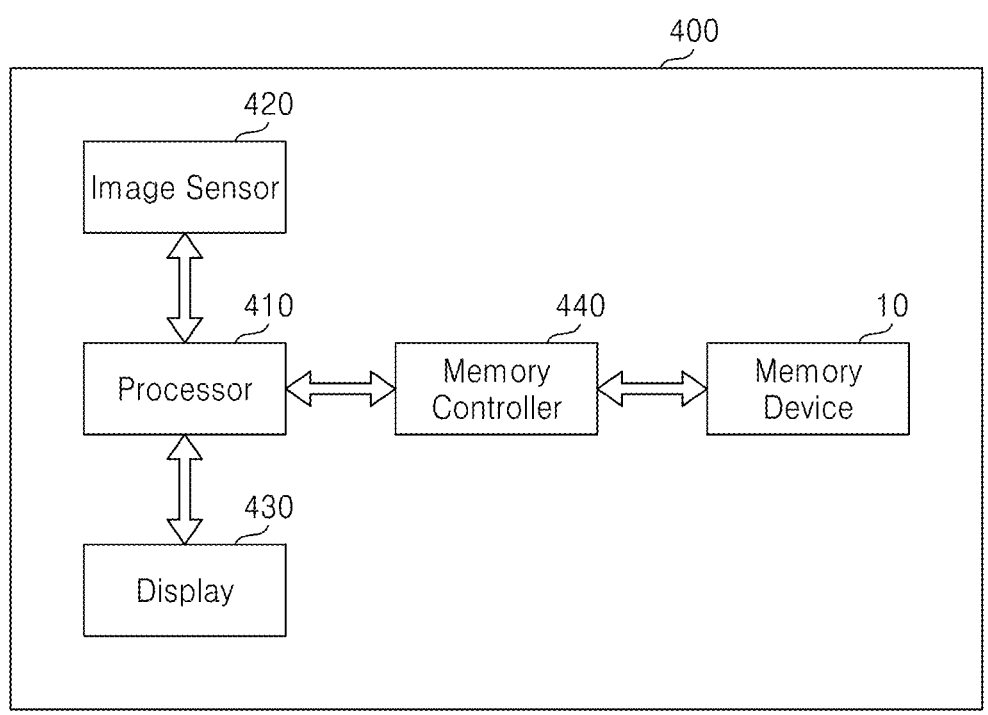
FIG. 12 is a block diagram of an electronic device including the non-volatile memory device illustrated in FIG. 1 according to other embodiments.

FIG. 12 is a block diagram of an electronic device 400 including the non-volatile memory device 10 illustrated in FIG. 1 according to other embodiments. The electronic device 400 may be implemented as an image processor like a digital camera, a cellular phone equipped with a digital camera, a smart phone equipped with a digital camera, or a tablet PC equipped with a digital camera.

The electronic device 400 may include the non-volatile memory device 10 and a memory controller 440 controlling the data processing operations, such as a program operation, an erase operation, and a read operation, of the non-volatile memory device 10. An image sensor 420 included in the electronic device 400 converts optical images into digital signals and outputs the digital signals to a processor 410 or the memory controller 440. The digital signals may be controlled by the processor 410 to be displayed through a display 430 or stored in the non-volatile memory device 10 through the memory controller 440.

Data stored in the non-volatile memory device 10 may be displayed through the display 430 according to the control of the processor 410 or the memory controller 440. The memory controller 440, which may control the operations of the non-volatile memory device 10, may be implemented as a part of the processor 410 or as a separate chip.

Figure 13:
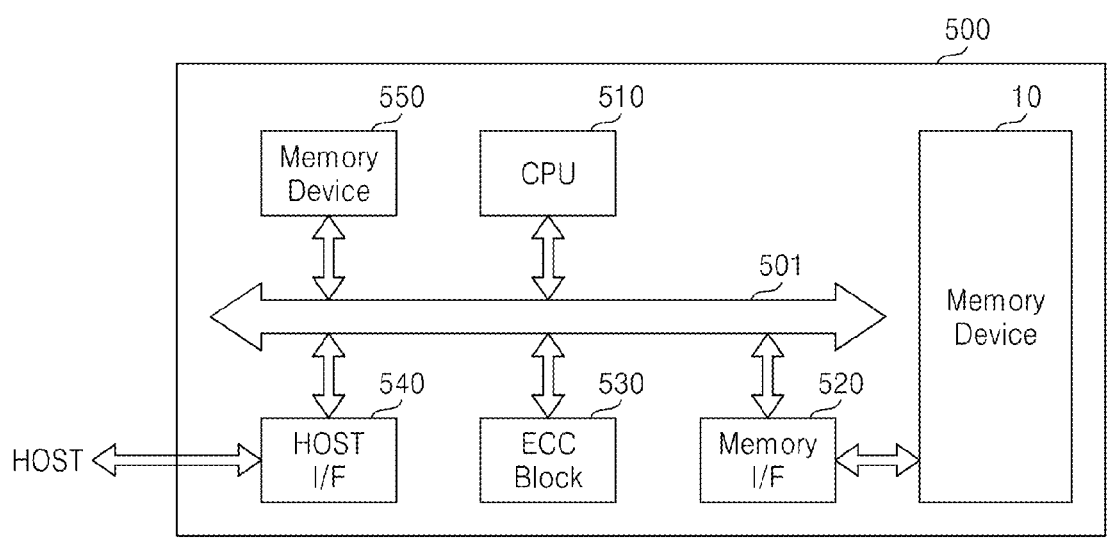
FIG. 13 is a block diagram of an electronic device including the non-volatile memory device illustrated in FIG. 1 according to yet other embodiments.

FIG. 13 is a block diagram of an electronic device 500 including the non-volatile memory device 10 illustrated in FIG. 1 according to yet other embodiments. The electronic device 500 may include the non-volatile memory device 10 and a central processing unit (CPU) 510 controlling the operations of the non-volatile memory device 10.

The electronic device 500 also may include a memory device 550 that may be used an operation memory of the CPU 510. The memory device 550 may be implemented by a non-volatile memory like read-only memory (ROM) or a volatile memory like static random access memory (SRAM). A host connected with the memory system 500 may perform data communication with the non-volatile memory device 10 through a memory interface 520 and a host interface 540.

An error correction code (ECC) block 530 may be controlled by the CPU 510 to detect an error bit included in data output from the non-volatile memory device 10 through the memory interface 520, correct the error bit, and transmit the error-corrected data to the host through the host interface 540. The CPU 510 may control data communication among the memory interface 520, the ECC block 530, the host interface 540, and the memory device 550 through a bus 501. The electronic device 500 may be implemented as a flash memory drive, a USB memory drive, an IC-USB memory drive, or a memory stick.

Figure 14:
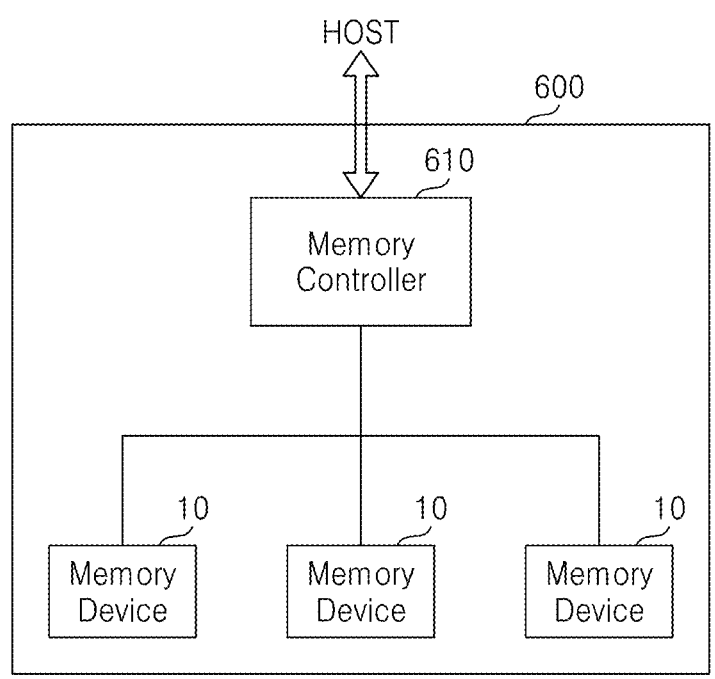
FIG. 14 is a block diagram of an electronic device including the non-volatile memory device illustrated in FIG. 1 according to still other embodiments.

FIG. 14 is a block diagram of an electronic device 600 including the non-volatile memory device 10 illustrated in FIG. 1 according to still other embodiments. The electronic device 600 may be implemented as a data storage system like a solid state drive (SSD).

The electronic device 600 may include a plurality of memory devices 10, and a memory controller 610 controlling the data processing operations of each of the memory devices 10. The electronic device 600 may be implemented as a memory module.

Figure 15:
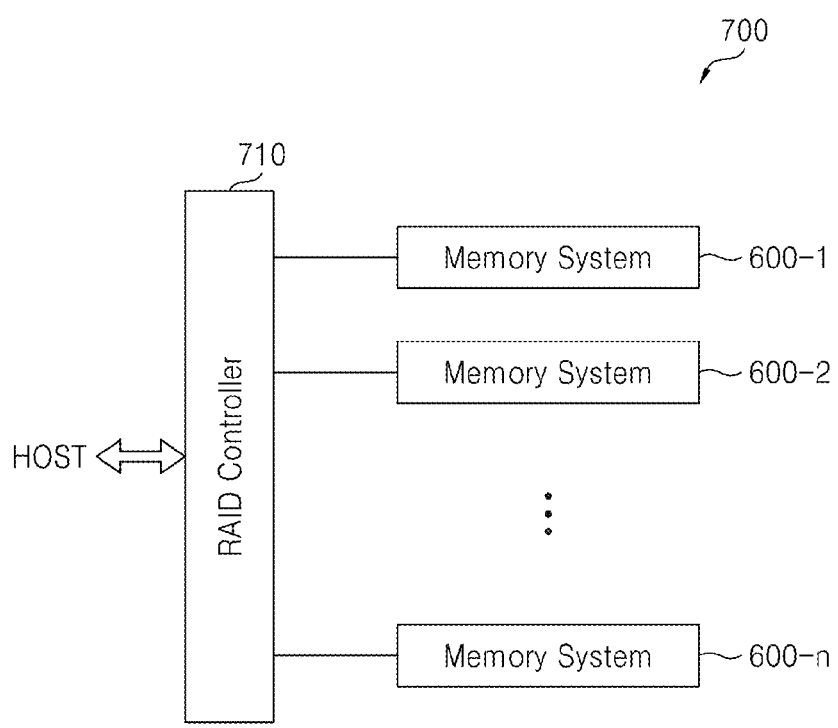
FIG. 15 is a block diagram of a data processing system including the electronic device illustrated in FIG. 14 according to some embodiments.

FIG. 15 is a block diagram of a data processing system 700 including the electronic device 600 illustrated in FIG. 14 according to some embodiments. Referring to FIGS. 14 and 15, the data processing system 700 may be implemented as a redundant array of independent disks (RAID) system. The data processing system 700 may include a RAID controller 710 and a plurality of electronic devices 600-1 through 600-n where "n" is a natural number.

Each of the electronic devices 600-1 through 600-n may be the electronic device 600 illustrated in FIG. 11. The electronic devices 600-1 through 600-n may form a RAID array. The data processing system 700 may be a PC or an SSD.

During a program operation, the RAID controller 710 may transmit program data output from a host to at least one of the electronic devices 600-1 through 600-n according to a RAID level in response to a program command received from the host. During a read operation, the RAID controller 710 may transmit to the host data read from at least one of the electronic devices 600-1 through 600-n in response to a read command received from the host.

The present embodiment can also be embodied as computer-readable codes on a computer-readable medium. The computer-readable recording medium is any data storage device that can store data as a program which can be thereafter read by a computer system. Examples of the computer-readable recording medium include a read-only memory (ROM), a random access memory (RAM), CD-ROMs, magnetic tapes, floppy disks, and optical data storage devices.

The computer-readable recording medium may also be distributed over network coupled computer systems so that the computer-readable code is stored and executed in a distributed fashion. Also, functional programs, codes, and code segments to accomplish the present general inventive concept can be easily construed by programmers.

According to some embodiments, a nonvolatile memory device adjusts an offset to get an effective offset for each of a plurality of memory cells according to a noise level of a CSL, thereby increasing the performance of a two-stage program-verify operation and reducing errors that may occur in a program-verify operation.

While the present disclosure has been particularly shown and described with reference to exemplary embodiments thereof, it will be understood by those of ordinary skill in the art that various changes in forms and details may be made therein without departing from the spirit and scope of the following claims.

What is claimed is:

1. A method of operating a nonvolatile memory device, the method comprising:
performing a plurality of program operations on a plurality of memory cells each to be programmed to one of a plurality of program states;
performing a program-verify operation on programmed memory cells of the plurality of memory cells, the programmed memory cells associated with each of the plurality of program states, wherein the program-verify operation comprises;
selecting one of a plurality of offsets based on a noise level of a common source line associated with a programmed memory cell of the programmed memory cells;
using the selected offset to select one of a first verify voltage and a second verify voltage higher than the first verify voltage; and
verifying a program state of the programmed memory cell using the first verify voltage and the second verify voltage,
wherein the selected offset is a difference between the first verify voltage and the second verify voltage, and
wherein a selected offset has an increased value as the number of program operations performed on the memory cells increases.

2. The method of claim 1, including performing the plurality of program operations on the memory cells in different word lines, wherein a selected offset has a decreased value as a position of a word line coupled to the programmed memory cell gets closer to the common source line.

3. The method of claim 1, wherein performing the plurality of program operations includes:
programming at least a first memory cell to a first program state having a first threshold voltage; and
programming at least a second memory cell to a second program state having a second threshold voltage higher than the first threshold voltage; and
wherein performing the program-verify operation includes:
for the first memory cell, selecting a first offset, using the first offset to select a first verify voltage, and verifying a program state of the first memory cell using the first verify voltage and a second verify voltage higher than the first verify voltage; and
for the second memory cell, selecting a second offset, using the second offset to select a first verify voltage, and verifying a program state of the second memory cell using the first verify voltage and a second verify voltage higher than the first verify voltage,
wherein the first offset is greater than the second offset.

4. The method of claim 1, wherein the program-verify operation includes a two-stage program-verify operation having a first program-verify operation step and a second program-verify operation step, and
wherein the first verify voltage is used during the first program-verify operation step and the second verify voltage is used during the second program-verify operation step.

5. The method of claim 1, wherein, for at least a first programmed memory cell, selecting one of the plurality of offsets includes selecting a verify voltage based on at least one of a program state of the first programmed memory cell, a position of a word line coupled to the first programmed memory cell, and a number of program operations performed on the memory cells.

6. The method of claim 1, wherein the selected offset is determined by using an e-fuse.

7. A method of programming a nonvolatile memory device comprising a plurality of memory cells, the method comprising:
performing a plurality of program operations for programming the memory cells to a plurality of program states;
selecting a first verify voltage for a first programmed memory cell;
selecting a first verify voltage for a second programmed memory cell;
performing a program-verify operation on the first programmed memory cell including verifying a program state of the first programmed memory cell using the first verify voltage associated with the first programmed memory cell and a second verify voltage associated with the first programmed memory cell, wherein the second verify voltage associated with the first programmed memory cell is higher than the first verify voltage associated with the first programmed memory cell; and performing a program-verify operation on the second programmed memory cell including verifying a program state of the second programmed memory cell using the first verify voltage associated with the second programmed memory cell and a second verify voltage associated with the second programmed memory cell, wherein the second verify voltage associated with the second programmed memory cell is higher than the first verify voltage associated with the second programmed memory cell, wherein, for each of the first and second programmed memory cells, selecting the first verify voltage includes selecting a first voltage when a noise level of a common source line associated with each of the first and second programmed memory cells is at a first level and selecting a second voltage when a noise level of a common source line associated with each of the first and second programmed memory cells is at a second level higher than the first level, and wherein a difference between the first voltage associated with the first programmed memory cell and the second verify voltage associated with the first programmed memory cell is greater than a difference between the second voltage associated with the first programmed memory cell and the second verify voltage associated with the first programmed memory cell.

8. The method of claim 7, wherein for at least one of the first or second programmed memory cell, selecting the first verify voltage includes selecting a verify voltage based on at least one of a program state of the programmed memory cell, a position of a word line coupled to the programmed memory cell, and a number of program operations performed on the memory cells.

9. The method of claim 7, including performing the plurality of program operations on the memory cells in different word lines, wherein a difference between the first verify voltage associated with the first programmed memory cell and the second verify voltage associated with the first programmed memory cell has a decreased value as a position of a word line coupled to the first programmed memory cell gets closer to a corresponding common source line.

10. The method of claim 7, including performing the plurality of program operations on the memory cells, wherein a difference between the first verify voltage associated with the first programmed memory cell and the second verify voltage associated with the first programmed memory cell has an increased value as the number of program operations performed on the memory cells increases.

11. The method of claim 7, wherein performing the plurality of program operations includes:

programming at least a first memory cell to a first program state having a first threshold voltage; and programming at least a second memory cell to a second program state having a second threshold voltage higher than the first threshold voltage; and performing the program-verify operation includes:

for the first memory cell, selecting a first verify voltage, and verifying a program state of the first memory cell using the first verify voltage and a second verify voltage higher than the first verify voltage; and for the second memory cell, selecting a first verify voltage, and verifying a program state of the second memory cell using the first verify voltage and a second verify voltage higher than the first verify voltage, wherein a difference between the first verify voltage and the second verify voltage used to verify the program state of the first memory cell is greater than a difference between the first verify voltage and the second verify voltage used to verify the program state of the second memory cell.

12. The method of claim 7, wherein the first voltage or the second voltage is determined by using an e-fuse.

13. A nonvolatile memory device comprising:

a memory cell array comprising a plurality of memory cells configured to be programmed to a plurality of program states;

a control logic circuit configured to select one of a plurality of offsets based on a noise level of a common source line associated with a programmed memory cell to be programmed to a particular program state among the plurality of program states, and generate a control signal for controlling the selected offset to be used to select one of a first verify voltage and a second verify voltage; and a voltage generator configured to generate the first verify voltage or the second verify voltage in response to the control signal during a program-verify operation of the programmed memory cell, wherein the program-verify operation includes a two-stage program-verify operation having a first program-verify operation step and a second program-verify operation step, wherein the first program-verify operation step is performed using the first verify voltage and the second program-verify operation step is performed using the second verify voltage higher than the first verify voltage, wherein the selected offset is a difference between the first verify voltage and the second verify voltage, and wherein lower offset values are associated with programmed memory cells subject to higher noise level caused by the common source line and higher offset values are associated with programmed memory cells subject to lower noise level caused by the common source line.

14. The nonvolatile memory device of claim 13, wherein the control logic circuit is configured to select one of the plurality of offsets based on at least one of a program state of the programmed memory cell, a position of a word line coupled to the programmed memory cell, and the number of program operations performed on the memory cells.

15. The nonvolatile memory device of claim 13, wherein the selected offset has a decreased value as a position of a word line coupled to the programmed memory cell gets closer to the common source line.

16. The nonvolatile memory device of claim 13, wherein the selected offset has an increased value as the number of program operations performed on the memory cells increases.

17. The nonvolatile memory device of claim 13, wherein a first memory cell of the memory cells is configured to be programmed to a first program state and a second memory cell of the memory cells is configured to be programmed to a second program state, wherein a threshold voltage associated with the first program state is lower than a threshold voltage of the second program state, wherein control circuit is configured to select a first offset to verify the first memory cell and a second offset to verify the second memory cell, and wherein the first offset is greater than the second offset.

18. The nonvolatile memory device of claim 13, wherein the control logic circuit comprises:

a storage circuit configured to store the plurality of offsets;

a setting circuit configured to select one of the plurality of offsets based on a noise level of the common source line of the programmed memory cell; and an output circuit configured to output the control signal for generating the first-stage verify voltage reflecting the selected offset.

19. The nonvolatile memory device of claim 13, wherein the control logic circuit includes an e-fuse circuit configured to select one of the plurality of offsets.

* * * * *